(12) United States Patent
Liaw

(10) Patent No.: US 10,998,310 B2
(45) Date of Patent: May 4, 2021

(54) FINS WITH WIDE BASE IN A FINFET

(71) Applicant: TAIWAN SEMICONDUCTOR MANUFACTURING COMPANY LTD., Hsinchu (TW)

(72) Inventor: Jhon-Jhy Liaw, Hsinchu County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 72 days.

(21) Appl. No.: 16/030,166

(22) Filed: Jul. 9, 2018

(65) Prior Publication Data
US 2020/0013776 A1    Jan. 9, 2020

(51) Int. Cl.
| | | |
|---|---|---|
| *H01L 27/08* | (2006.01) | |
| *H01L 27/088* | (2006.01) | |
| *H01L 29/10* | (2006.01) | |
| *H01L 21/8234* | (2006.01) | |
| *H01L 21/308* | (2006.01) | |
| *H01L 29/06* | (2006.01) | |

(52) U.S. Cl.
CPC ........ *H01L 27/0886* (2013.01); *H01L 21/308* (2013.01); *H01L 21/823431* (2013.01); *H01L 29/0619* (2013.01); *H01L 29/1095* (2013.01)

(58) Field of Classification Search
CPC .............. H01L 27/0886; H01L 21/308; H01L 21/823431; H01L 29/0619; H01L 29/1095
See application file for complete search history.

(56) References Cited

U.S. PATENT DOCUMENTS

| | | | |
|---|---|---|---|
| 8,586,455 B1 * | 11/2013 | Chang | ............. H01L 21/823431 438/481 |
| 8,796,666 B1 | 8/2014 | Huang et al. | |
| 8,815,712 B2 | 8/2014 | Wan et al. | |
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 9,595,475 B2 | 3/2017 | Liaw | |
| 9,741,717 B1 * | 8/2017 | Cheng | ............... H01L 21/02274 |

(Continued)

*Primary Examiner* — Peter Bradford
(74) *Attorney, Agent, or Firm* — WPAT, P.C., Intellectual Property Attorneys; Anthony King

(57) ABSTRACT

The semiconductor device includes a substrate, a fin structure, a source/drain region, and a gate structure. The fin structure includes a first-stage fin region, a second-stage fin region, and a third-stage fin region. The second-stage fin region is under the first-stage fin region. The third-stage fin region is under the second-stage fin region. The source/drain region is on a top surface of the second-stage fin region. The gate structure is over the first-stage fin region and wraps around a top surface and sidewalls of the first-stage fin region. The top surface of the second-stage fin region is lower than the top surface of the first-stage fin region. A width of the third-stage fin region is greater than a width of the second-stage fin region, and the width of the second-stage fin region is substantially the same as a width of the first-stage fin region.

20 Claims, 13 Drawing Sheets

(56) References Cited

U.S. PATENT DOCUMENTS

2016/0155670 A1* 6/2016 Liaw .............. H01L 21/823431
                                                              257/401
2016/0284701 A1* 9/2016 Guo ................ H01L 29/66636
2016/0315146 A1* 10/2016 Jung ................. H01L 29/0847
2018/0151564 A1* 5/2018 Lee .................. H01L 29/66545

* cited by examiner

FINS WITH WIDE BASE IN A FINFET

BACKGROUND

The electronics industry has experienced ever-increasing demand for smaller and faster electronic devices which are able to support a greater number of increasingly complex and sophisticated functions. Accordingly, there is a continuing demand for the semiconductor industry to manufacture low-cost, high-performance, and low-power integrated circuits (ICs). Thus these goals have been achieved in large part by scaling down semiconductor IC dimensions (e.g., minimum feature size) and thereby improving production efficiency and reducing associated costs. However, such downscaling has also introduced increased complexity to the semiconductor manufacturing process. Thus, the realization of continued advances in semiconductor ICs and devices is dependent on similar advances in semiconductor manufacturing operations and technology.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
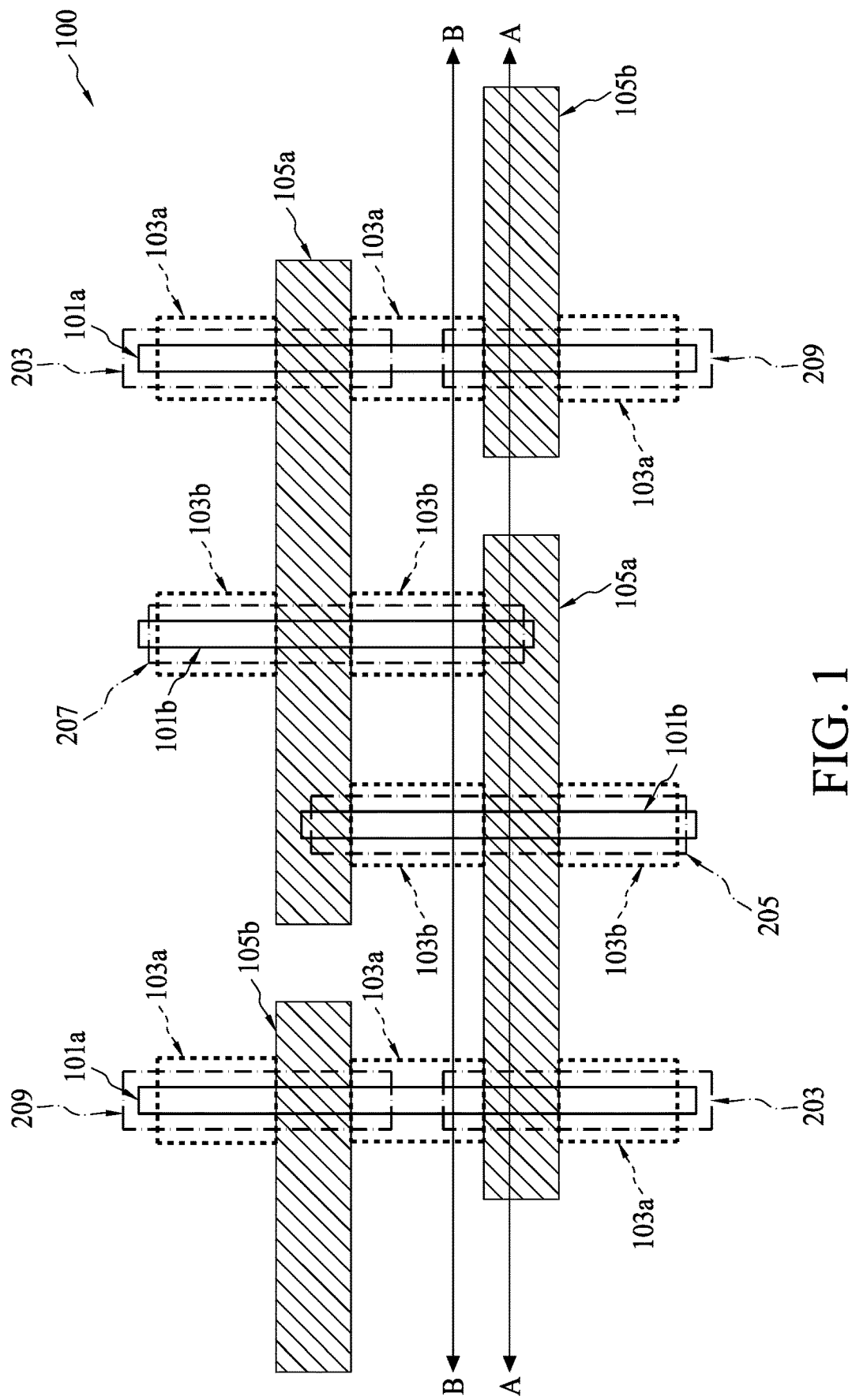
FIG. 1 illustrates a top view of a semiconductor device fabricated in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper," "lower," "left," "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from deviations normally occurring in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Recently, multi-gate devices have been introduced in an effort to improve gate control by increasing gate-channel coupling, reducing OFF-state current, and reducing short-channel effects (SCEs). One such multi-gate device that has been introduced is the fin field-effect transistor (FinFET). The FinFET gets its name from the fin-like structure which extends from a substrate on which it is formed, and which is used to form the FET channel. FinFETs are compatible with conventional complementary metal-oxide-semiconductor (CMOS) operations and their three-dimensional structure allows them to be aggressively scaled while maintaining gate control and mitigating SCEs.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers, or mandrels, may then be used to pattern the fins.

It is also noted that the present disclosure presents embodiments in the form of multi-gate transistors or fin-type multi-gate transistors referred to herein as FinFET devices. Such a device may include a P-type metal-oxide-semiconductor FinFET device or an N-type metal-oxide-semiconductor FinFET device. The FinFET device may be a dual-gate device, tri-gate device, bulk device, silicon-on-insulator (SOI) device, and/or another configuration. One of ordinary skill may recognize other examples of semiconductor devices that may benefit from aspects of the present disclosure. For example, some embodiments described herein may also be applied to gate-all-around (GAA) devices, Omega-gate (Ω-gate) devices, or Pi-gate (Π-gate) devices.

Figure 2A:
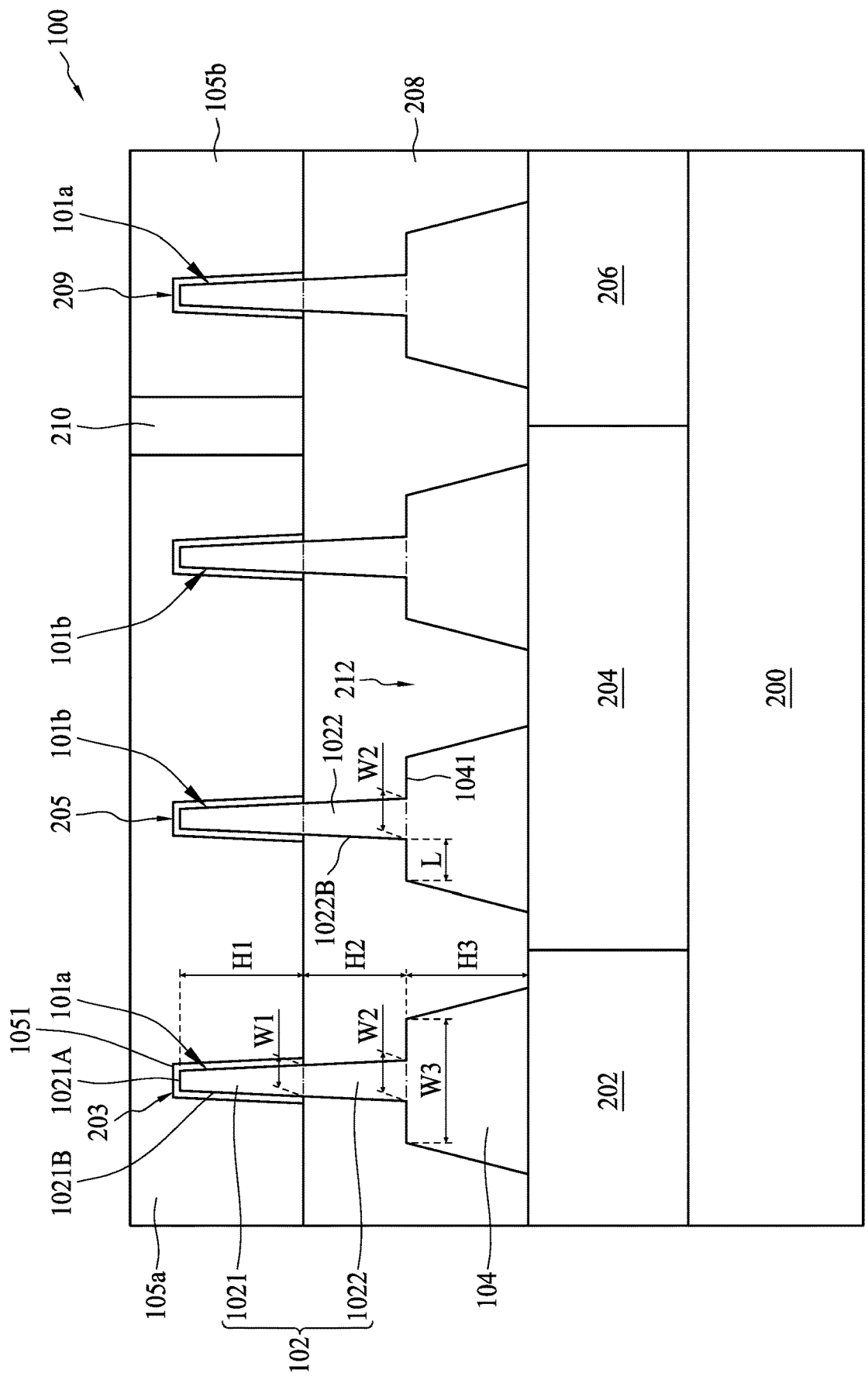
FIG. 2A illustrates a cross-sectional view of a semiconductor device along a plane substantially parallel to line AA of FIG. 1.
Figure 2B:
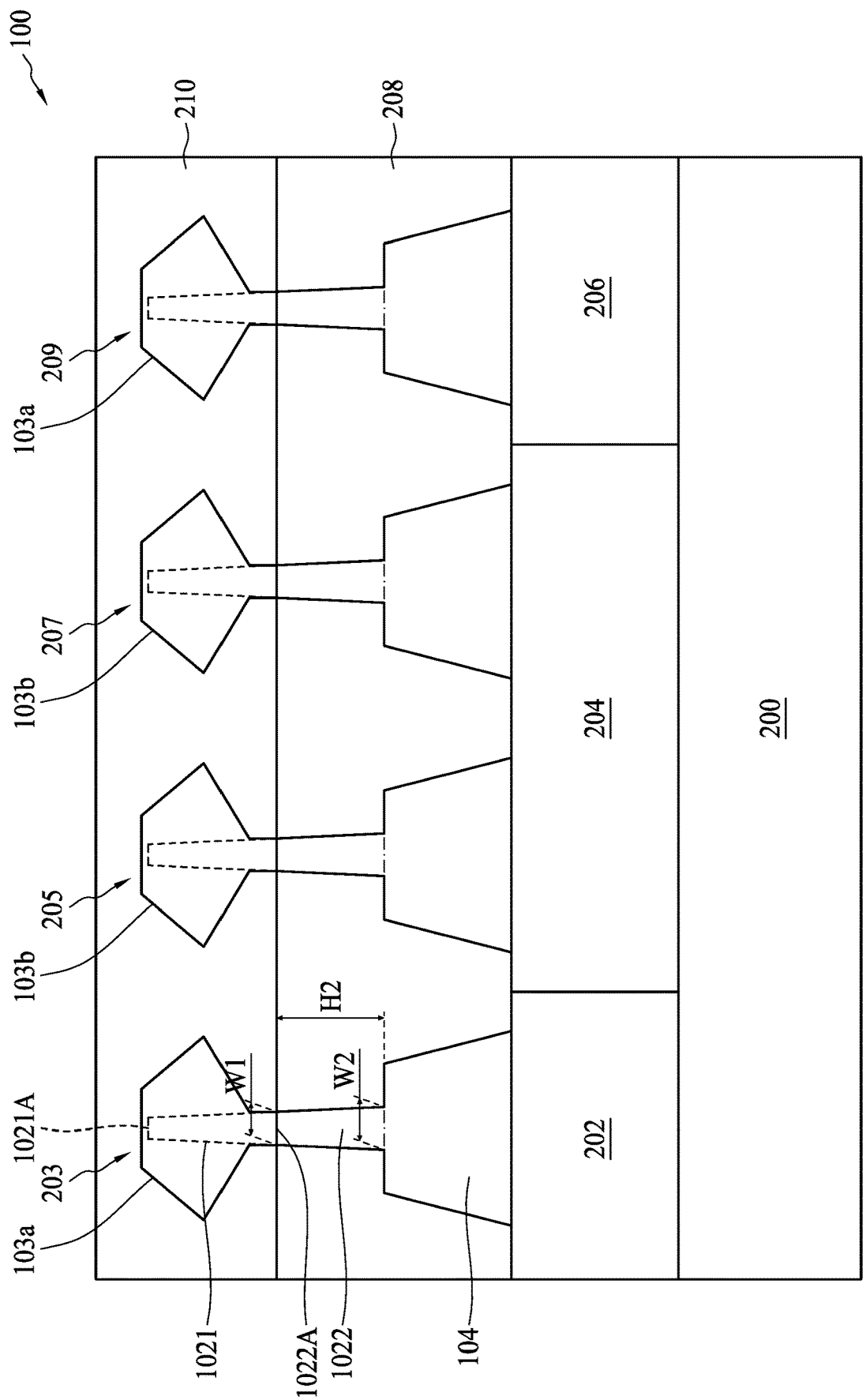
FIG. 2B illustrates a cross-sectional view of a semiconductor device along a plane substantially parallel to line BB of FIG. 1.

FIG. 1 illustrates a top view of a semiconductor device 100 fabricated in accordance with some embodiments. FIG. 2A illustrates a cross-sectional view of a semiconductor device 100 along a plane substantially parallel to line AA of FIG. 1. FIG. 2B illustrates a cross-sectional view of a semiconductor device 100 along a plane substantially parallel to line BB of FIG. 1.

In some embodiments, the semiconductor device 100 may include various other devices and features, such as additional transistors, bipolar junction transistors, resistors, capacitors, inductors, diodes, fuses, static random access memory (SRAM) and/or other logic circuits. The embodiments described herein are simplified for a better understanding of the inventive concepts of the present disclosure. In some embodiments, the semiconductor device 100 includes a plurality of semiconductor devices (e.g., transistors), including PFETs, NFETs and other semiconductor devices, which may be interconnected.

Referring to FIG. 1, FIG. 2A, and FIG. 2B, the semiconductor device 100 may include one or more fin structures 101a and 101b, one or more source/drain regions 103a and 103b, and one or more gate structures 105a and 105b. It will be understood that a fin channel region (i.e., a FinFET channel region) is disposed within each of the fin structures, beneath the gate structures 105a, 105b. It should be noted that the plurality of fin structures 101a and 101b, the plurality of source/drain regions 103a and 103b, and the plurality of gate structures 105a and 105b are shown merely for purposes of illustration. In some embodiments, there may be more or less of each of the fin structures, source/drain regions, or gate structures. Examples of the various embodiments provided herein are illustrative, and are not meant to be limiting in any way, beyond the language recited in the claims below.

Referring to FIG. 2A, the semiconductor device 100 is formed on a substrate 200 having well regions 202, 204 and 206. Each of the well regions 202, 204 and 206 may include an N-type or a P-type well region. In some embodiments, incorporation of one or more dopants into each of the well regions 202, 204 and 206 may be performed by ion implantation, in situ epitaxial growth, or another method. The semiconductor device 100 includes the fin structures 101a and 101b, wherein the fin structures 101a and 101b may include multi-stage fin regions. In some embodiments, each of the fin structures 101a and 101b includes a first fin part 102 and a second fin part 104 under the first fin part 102. The first fin part 102 may include a first-stage fin region 1021 and a second-stage fin region 1022 under the first-stage fin region 1021. In one or more embodiments, the first fin part 102 may be a protrusion portion and the second fin part 104 may be a base portion. In some embodiments, the second fin part 104 may also be a third-stage fin region under the second-stage fin region 1022, and the second fin part 104 is described hereinafter as the third-stage fin region 104 for better understanding.

It should be noted that the cross-sectional shape of the first fin part 102 and the second fin part 104 may be rectangular, tapered rectangular or another shape, and the embodiment described herein is not intended to be limiting.

In some embodiments, doping of each of the fin structures 101a and 101b may be performed using an ion implantation operation that employs a suitable N-type or P-type dopant. Alternatively, in other embodiments, the first-stage fin region 1021, the second-stage fin region 1022, and/or the third-stage fin region 104 may include one or more epitaxially-grown, doped layers. In some embodiments, the first-stage fin region 1021, the second-stage fin region 1022 and the third-stage fin region 104 may include both N-type and P-type fins, wherein each of the N-type and P-type fins is implanted using separate operations.

In some embodiments, an N-type dopant may include arsenic, phosphorous, antimony, nitrogen, carbon, another N-type donor material, or a combination thereof. In some embodiments, a P-type dopant may include boron, aluminum, gallium, indium, boron difluoride ($BF_2$), another P-type acceptor material, or a combination thereof. In some embodiments, N-type or P-type dopants may be used to perform anti-punch through (APT) ion implantation in the first-stage fin region 1021, the second-stage fin region 1022, and/or the third-stage fin region 104. In one or more embodiments, the second-stage fin region 1022 may particularly be used as an APT doping area. In other embodiments, other ion implantation operations may also be performed in the first-stage fin region 1021, the second-stage fin region 1022, and/or the third-stage fin region 104, including a threshold voltage (Vt) adjust implant, a halo implant, a well implant, or other suitable implant.

It should be noted that the first-stage fin region 1021, the second-stage fin region 1022 and the third-stage fin region 104, like the substrate 200, may include silicon or another elementary semiconductor such as germanium (Ge), silicon carbide (SiC), silicon germanium (SiGe) or diamond. Alternatively, the first-stage fin region 1021, the second-stage fin region 1022 and the third-stage fin region 104 may include a compound semiconductor and/or an alloy semiconductor. In some other embodiments, the first-stage fin region 1021, the second-stage fin region 1022 and the third-stage fin region 104 may also include silicon phosphide (SiP), silicon phosphorus carbide (SiPC), a silicon-on-insulator (SOI) structure, a SiGe-on-SOI structure, a Ge-on-SOI structure, a III-VI material, or any combination of the above materials. Further, the first-stage fin region 1021, the second-stage fin region 1022 and the third-stage fin region 104 may optionally include an epitaxial layer (epi-layer), may be strained for performance enhancement, and may have other suitable enhancement features.

Referring to FIG. 1, FIG. 2A and FIG. 2B, the source/drain regions 103a and 103b are formed on the top surfaces 1022A of the second-stage fin regions 1022, and connect with either side of the fin channel regions (i.e., the dotted line first-stage fin regions 1021 in FIG. 2B). The top surface 1022A of the second-stage fin region 1022 is lower than a top surface 1021A of the first-stage fin region 1021. In some embodiments, the source/drain regions 103a and 103b may be epitaxially grown from the top surfaces 1022A of the second-stage fin regions 1022. The source/drain region 103a may include an N-type source/drain region, and the source/drain region 103b may include a P-type source/drain region. It should be noted that the cross-sectional shapes of the source/drain regions 103a and 103b are merely for example and are not intended to be limiting.

In some embodiments, one or more of the plurality of fin structures 101a and 101b may share common gate structures 105a and 105b. The gate structures 105a and 105b are formed over the first-stage fin regions 1021 to wrap around the top surfaces 1021A and sidewalls 1021B of the first-stage fin regions 1021.

The gate structures 105a and 105b may be high-K/metal gate stacks. The gate structures 105a and 105b may include an interfacial layer 1051 formed over the first-stage fin regions 1021 (which includes a FinFET channel region), a high-K gate dielectric layer (not shown) formed over the interfacial layer 1051, and a metal layer (not shown) formed over the high-K gate dielectric layer. High-K gate dielectrics, as used and described herein, include dielectric material having a high dielectric constant, for example, greater than that of thermal silicon oxide (approximately 3.9). The metal layer used within the high-K/metal gate stack may include a metal, metal alloy, or metal silicide. Additionally, the formation of the gate structures 105a and 105b includes depositions to form various gate materials and one or more CMP processes to remove excessive gate materials and thereby planarize a top surface of the semiconductor device 100.

The well regions 202 and 206 may include a P-type well region, and the well region 204 may include an N-type well region. In such an example, the FinFET devices formed in the multi-stage fin structures may include N-type FinFETs 203 and 209 and P-type FinFETs 205 and 207. It should be noted that various other doping and device configurations may also be employed.

As an example, the semiconductor device 100 may include a SRAM cell. In such an example, the N-type FinFETs 203 may be a pull-down (PD) device, the P-type FinFETs 205 and 207 may be a pull-up (PU) device, and the N-type FinFETs 209 may be a pass-gate (PG) device. In some embodiments, the first-stage fin regions 1021 wrapped by the gate structure 105a in the P-type FinFETs 205 and 207 may be a SiGe channel region. The first-stage fin regions 1021 of the P-type FinFETs 205 and 207 may include a Ge atomic concentration between about 10% and about 40%. These are, of course, merely examples and are not intended to be limiting.

In some embodiments, a ratio (H1/H2) of a height H1 of the first-stage fin region 1021 to a height H2 of the second-stage fin region 1022 may be between about 0.5 and about 2.7. The height H1 of the first-stage fin region 1021 may be between about 40 nm and about 80 nm. The height H2 of the second-stage fin region 1022 may be between about 30 nm and about 70 nm. The height of the third-stage fin region may be between about 30 nm and about 120 nm. These are, of course, merely examples and are not intended to be limiting. The height H2 of the second-stage fin regions 1022 under the gate structures 105a and 105b may be greater than or substantially the same as the height H2 of the second-stage fin regions 1022 under the source/drain regions 103a and 103b.

In some embodiments, a width W3 of the third-stage fin region 104 is greater than a width W2 of the second-stage fin region 1022. The width W2 of the second-stage fin region 1022 may be greater than or substantially the same as a width W1 of the first-stage fin region 1021. A width W1 (e.g., the bottom surface, it may be substantially the same as the width W1 of the first-stage fin region 1021) of the source/drain regions 103a and 103b may be smaller than or substantially the same as the width W2 of the second-stage fin region 1022. The width W1 of the first-stage fin region 1021 may be between about 3 nm and about 10 nm. The width W2 of the second-stage fin region 1022 may be between about 5 nm and about 10 nm. The width W3 of the third-stage fin region 104 may be between about 30 nm and about 80 nm. The third-stage fin region 104 may include an extension portion 1041 extending from a sidewall 1022B of the second-stage fin region 1022. A width L of the extension portion 1041 may be between about 5 nm and about 40 nm. In some embodiments, the width L of the extension portion 1041 is substantially the same as the width W2 of the second-stage fin region 1022. These are, of course, merely examples and are not intended to be limiting.

In some embodiments, a dielectric layer 208 is deposited over the substrate 200. The trenches 212 between the fin structures 101a and 101b are filled with the dielectric layer 208 and thereby isolate the neighboring fin structures 101a and 101b. In some embodiments, an interlayer dielectric (ILD) layer 210 is deposited over the dielectric layer 208 to isolate the neighboring source/drain regions 103a and 103b. In one or more embodiments, the semiconductor device 100 may further include various features and regions known in the art, and the descriptions thereof are omitted herein for brevity.

With respect to the description provided herein, the present disclosure provides a multi-stage fin profile structure which addresses many of the shortcomings of current processing techniques, including misalignment of critical features and difficulty of deployment of strained layers on narrow fin structures. Furthermore, the first fin part 102 and the wider third-stage fin region 104 may increase the surface area for doping operations, resulting in increased doping efficiencies in the fin structures 101a and 101b. Thus, the semiconductor device 100 may be scaled down, and the well resistance and latch-up effect in each cell may be alleviated. In some embodiments, the second-stage fin region 1022 may be used as an APT doping area and the performance of the semiconductor device 100 may be further improved.

Figure 3:
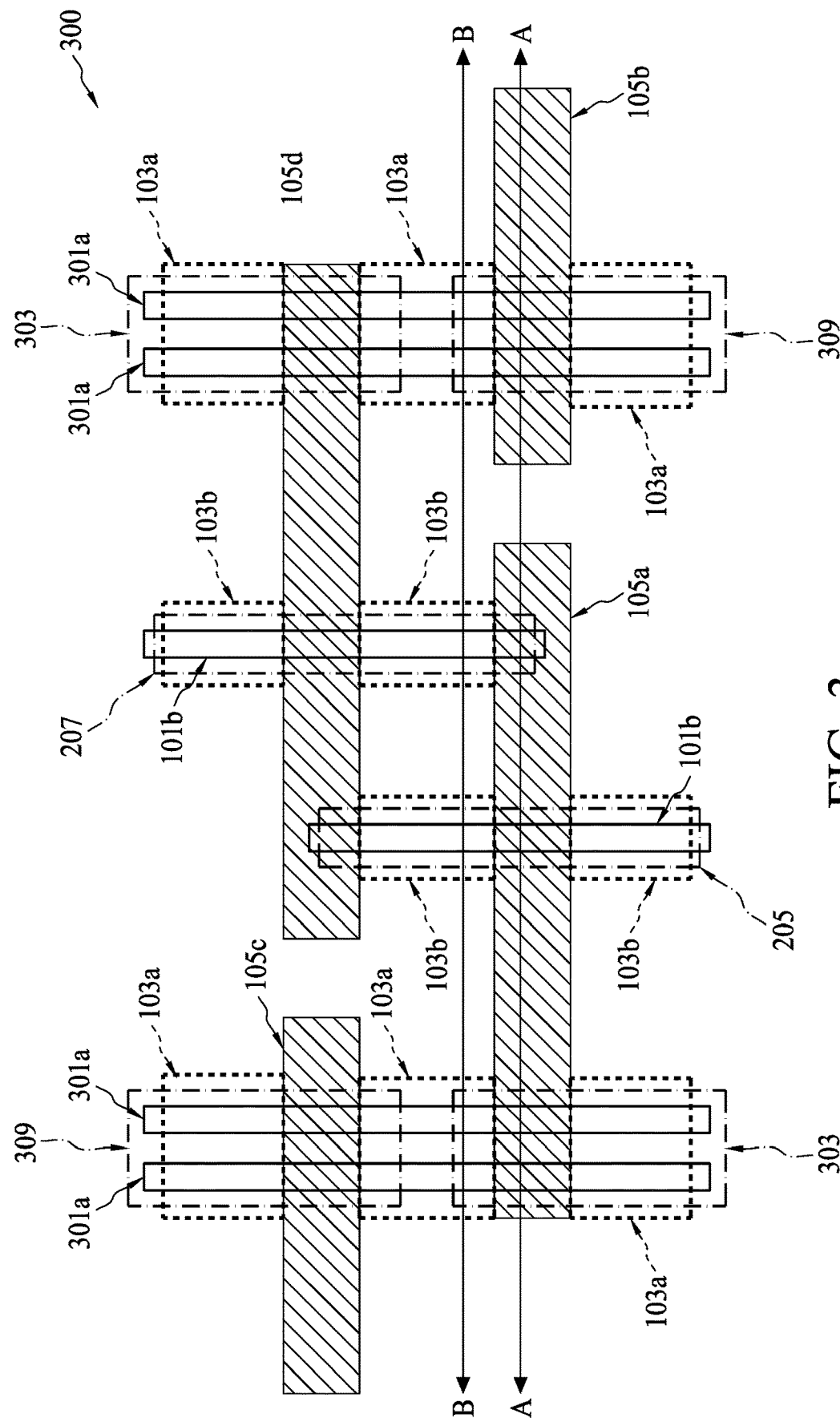
FIG. 3 illustrates a top view of a semiconductor device fabricated in accordance with some embodiments.
Figure 4A:
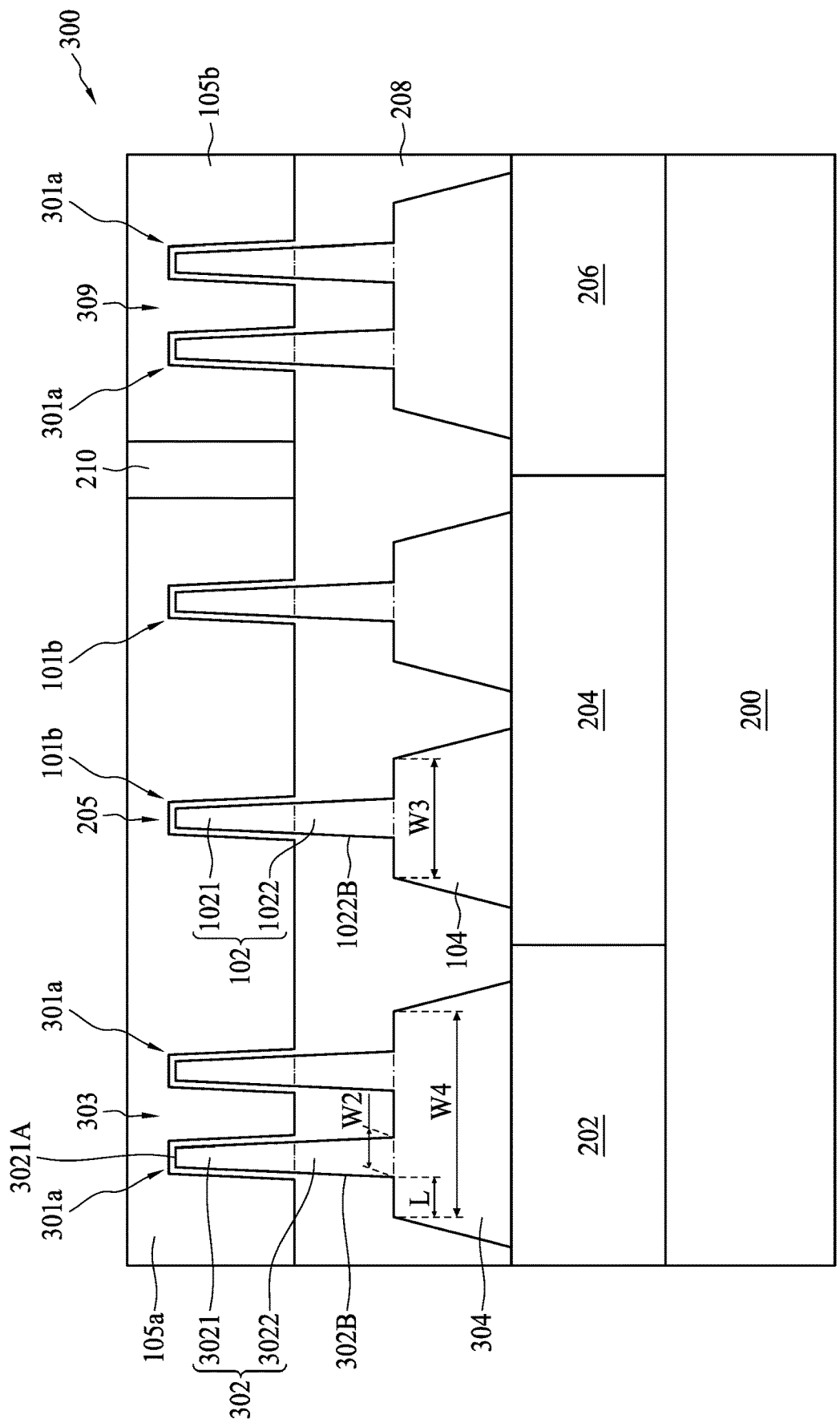
FIG. 4A illustrates a cross-sectional view of a semiconductor device along a plane substantially parallel to line AA of FIG. 3.
Figure 4B:
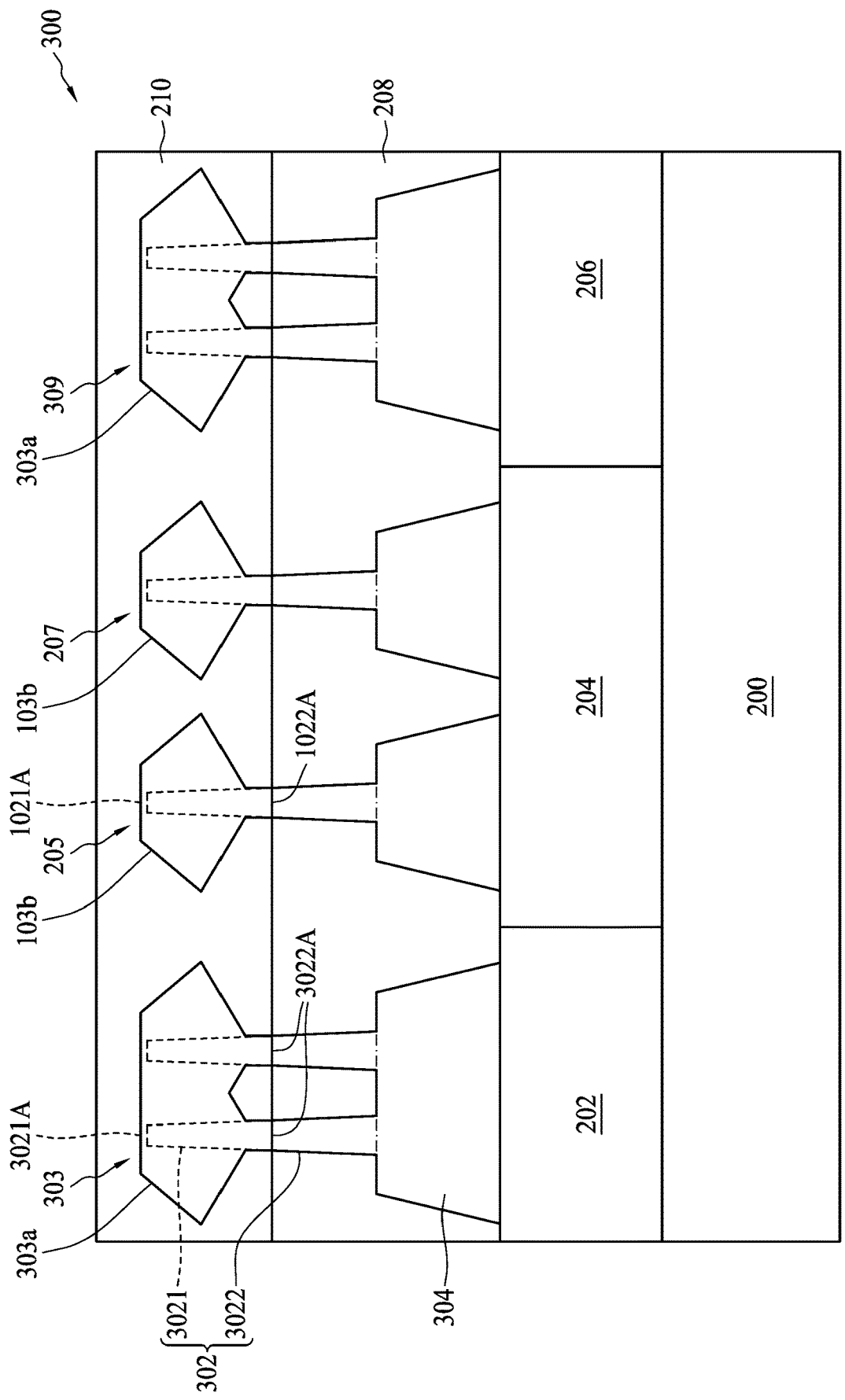
FIG. 4B illustrates a cross-sectional view of a semiconductor device along a plane substantially parallel to line BB of FIG. 3.

FIG. 3 illustrates a top view of a semiconductor device 300 fabricated in accordance with some embodiments. FIG. 4A illustrates a cross-sectional view of a semiconductor device 300 along a plane substantially parallel to line AA of FIG. 3. FIG. 4B illustrates a cross-sectional view of a semiconductor device 300 along a plane substantially parallel to line BB of FIG. 3.

Referring to FIG. 3, FIG. 4A and FIG. 4B, the difference between the semiconductor device 300 and the semiconductor device 100 is that the semiconductor device 300 includes a first fin structure 301a and the second fin structure 101b. The first fin structure 301a may include a first base portion 304 and a plurality of first protrusion portions 302. The first base portion 304 may include an extension portion 3041. The extension portion 3041 extends laterally from sidewalls 302B of the first protrusion portions 302 and forms steps at both sides of the first fin structure 301a. A width L of the extension portion 3041 may be between about 5 nm and about 40 nm. In some embodiments, the width L of the extension portion 3041 is substantially the same as the width W2 of the first protrusion portion 302. These are, of course, merely examples and are not intended to be limiting.

In one or more embodiments, the first protrusion portions 302 may be a first fin part and the first base portion 304 may be a second fin part. The first protrusion portions 302 may further include a first-stage fin region 3021 and a second-stage fin region 3022 under the first-stage fin region 3021. In some embodiments, the first base portion 304 may also be a third-stage fin region under the second-stage fin region 3022.

The second fin structure 101b may include a second base portion 104 and a second protrusion portion 102. The second base portion 104 extends laterally from sidewalls 1022B of the second protrusion portion 102 and forms steps at both sides of the first fin structure 301a. The second fin structure 101b is similar to the fin structures 101a and 101b in FIG. 1, FIG. 2A and FIG. 2B, and the detailed description thereof is omitted herein for brevity.

In some embodiments, a width W4 of the first base portion 304 is greater than the width W3 of the second base portion 104. The width W4 of the first base portion 304 may be between about 55 nm and about 150 nm.

In some embodiments, the source/drain region 303a is formed on the top surfaces 3022A of the plurality of first protrusion portions 302, and is connected to either side of the fin channel regions (i.e., the first-stage fin regions 3021 indicated by dotted line in FIG. 4B). The top surface 3022A of the first protrusion portion 302 is lower than a top surface 3021A of the first protrusion portion 302. The source/drain regions 303a may be epitaxially grown from the top surfaces 3022A of the first protrusion portions 302. The source/drain regions 303a may include N-type source/drain regions. It should be noted that the cross-sectional shapes of the source/drain regions 303a are merely for example and are not intended to be limiting. The source/drain region 103b and gate structures 105a and 105b are similar to the source/drain region 103b and gate structures 105a and 105b in FIG. 1, FIG. 2A and FIG. 2B, and the detailed description thereof is omitted herein for brevity.

Similar to the semiconductor device 100 in FIG. 1, FIG. 2A and FIG. 2B, the well regions 202 and 206 may include a P-type well region, and the well region 204 may include an N-type well region. In such an example, the FinFET devices formed in the multi-stage fin structures may include multi-fin N-type FinFETs 303 and 309 and P-type FinFETs 205 and 207. It should be noted that various other doping and device configurations may also be employed.

As an example, the semiconductor device 300 may include a SRAM cell. In such an example, the multi-fin N-type FinFETs 303 may be a pull-down (PD) device, the P-type FinFETs 205 and 207 may be a pull-up (PU) device, and the multi-fin N-type FinFETs 309 may be a pass-gate (PG) device. In some embodiments, the second protrusion portions 102 wrapped by the gate structure 105a in the P-type FinFETs 205 and 207 may be a SiGe channel region. The second protrusion portions 102 of the P-type FinFETs 205 and 207 may include a Ge atomic concentration between about 10% and about 40%. These are, of course, merely examples and are not intended to be limiting.

Briefly, the features described in FIG. 1, FIG. 2A and FIG. 2B may also be applied to a multi-fin structure such as the first fin structure 301a. As described above, the protrusion portions 102 and 302 and the wider base portions 104 and 304 may increase the surface area for doping operation, thereby increasing the doping efficiency in the fin structures 101b and 301a. Thus, semiconductor device 300 may be scaled down, and the well resistance and latch-up effect in each cell may be alleviated.

Figure 5:
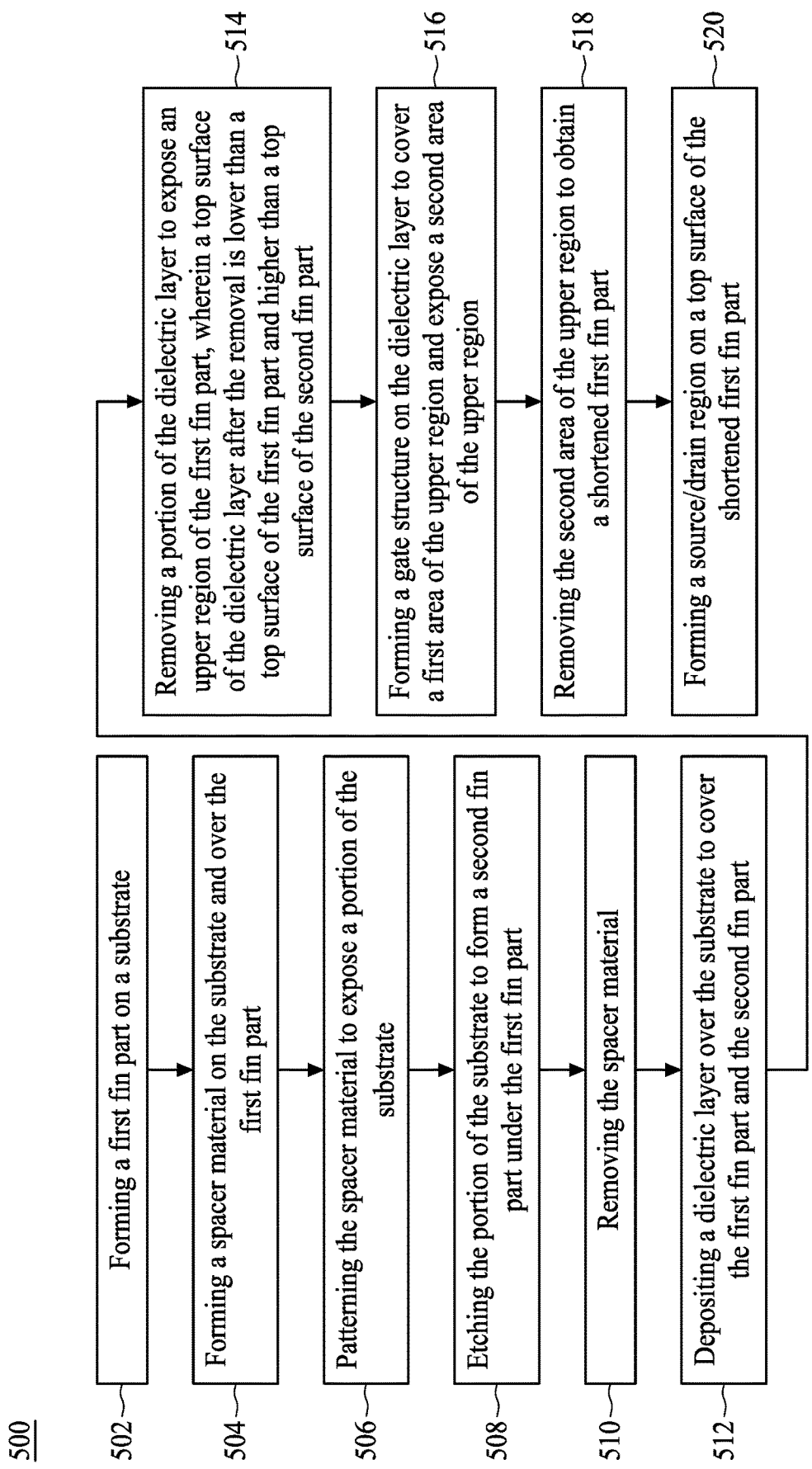
FIG. 5 is a flowchart of a method of fabricating the semiconductor device or portion thereof according to one or more aspects of the present disclosure.

FIG. 5 is a flowchart of a method 500 of fabricating the semiconductor device 300 or a portion thereof according to one or more aspects of the present disclosure. FIG. 6 to FIG. 16 are cross-sectional views of an embodiment of the semiconductor device 300 according to various stages of the method 500 of FIG. 5.

It is understood that parts of the semiconductor device 300 may be fabricated by a CMOS technology process flow, and thus some operations are only briefly described herein. Moreover, it should be noted that the operations of method 500, including any descriptions given with reference to FIG. 6 to FIG. 16, are merely exemplary and are not intended to be limiting beyond what is specifically recited in the claims that follow. For better understanding, FIG. 6 to FIG. 16 present only a portion of the semiconductor device 300 as described in FIG. 3, FIG. 4A and FIG. 4B. These are, of course, merely examples and the method 500 may also be applied to the semiconductor device 100 described in FIG. 1, FIG. 2A and FIG. 2B.

Figure 7:
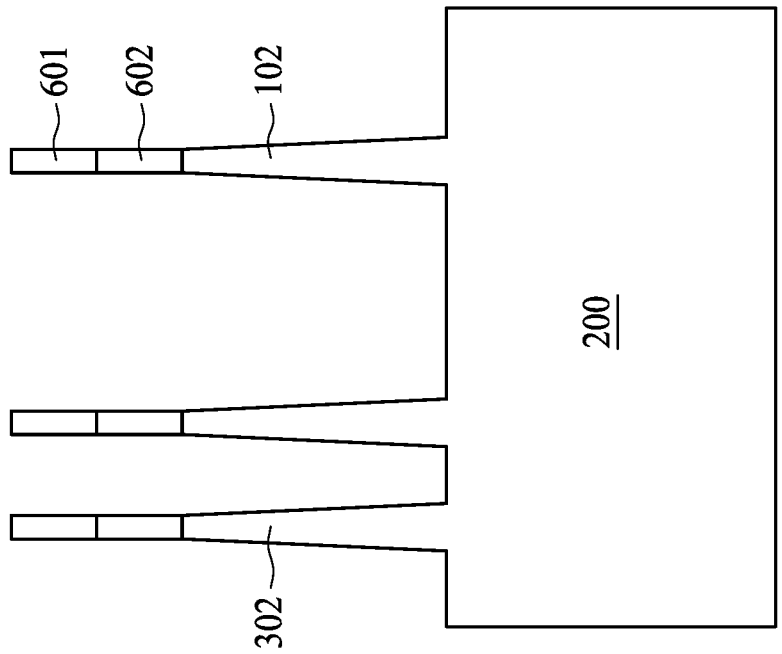
FIG. 6 to FIG. 16 are cross-sectional views of an embodiment of the semiconductor device according to various stages of the method of FIG. 5.
Figure 6:
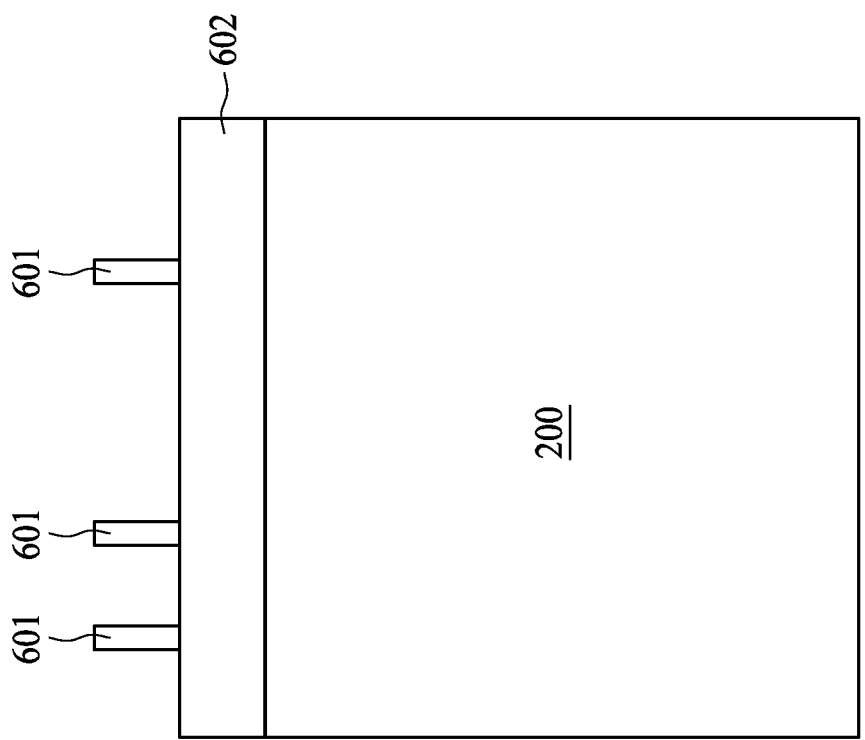

Referring to FIG. 5, FIG. 6 and FIG. 7, the method 500 includes operation 502, in which the first fin parts 102 and 302 are formed on a substrate 200. Referring to FIG. 6, a spacer layer 601 and a hard mask layer 602 are formed on the substrate 200. The spacer layer 601 and the hard mask layer 602 may include a dielectric material such as silicon oxide ($SiO_2$), silicon nitride ($Si_3N_4$), silicon oxynitride (SiON), a high-K dielectric material, silicon carbide, or a combination thereof. The spacer layer 601 is then patterned to define the first fin part regions. Referring to FIG. 7, the hard mask layer 602 is etched and the first fin part regions are formed as defined by the spacer layer 601. Further, the substrate 200 is then etched (e.g., by a wet etch or a dry etch) to form a plurality of first fin parts 102 and 302, wherein the spacer layer 601 and the hard mask layer 602 serve as etch masks, and the pattern defined by the spacer layer 601 and the hard mask layer 602 is transferred to the substrate 200.

Figure 8:
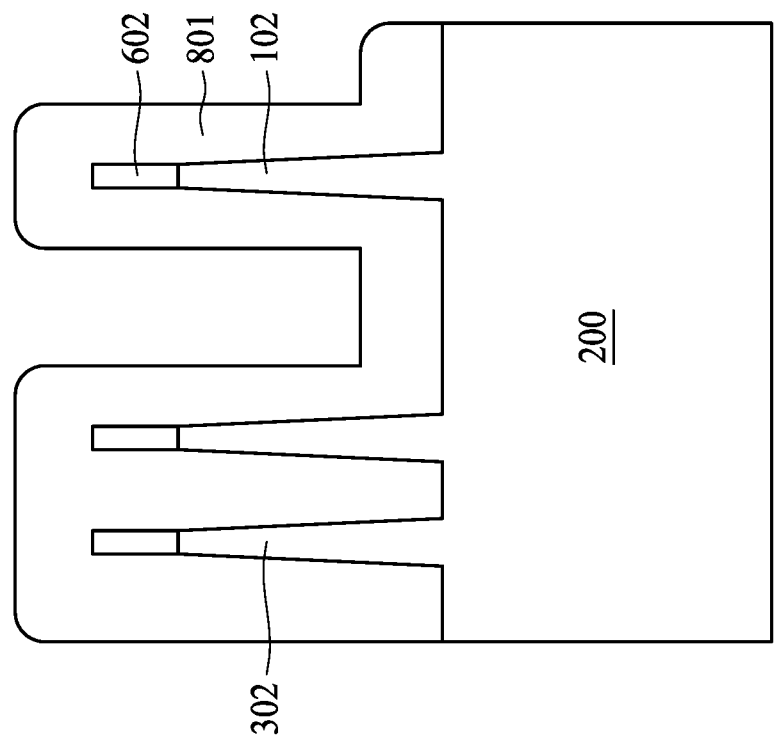

Referring to FIG. 5 and FIG. 8, the method 500 includes operation 504, in which a spacer material 801 is formed on the substrate 200 and over the first fin parts 102 and 302. As shown in FIG. 8, in some embodiments, the spacer layer 601 may be selectively removed prior to formation of the spacer material 801. The spacer material 801, like the spacer layer 601 and the hard mask layer 602, may include a dielectric material such as silicon oxide ($SiO_2$), silicon nitride ($Si_3N_4$), silicon oxynitride (SiON), a high-K dielectric material, silicon carbide, or a combination thereof.

Figure 9:
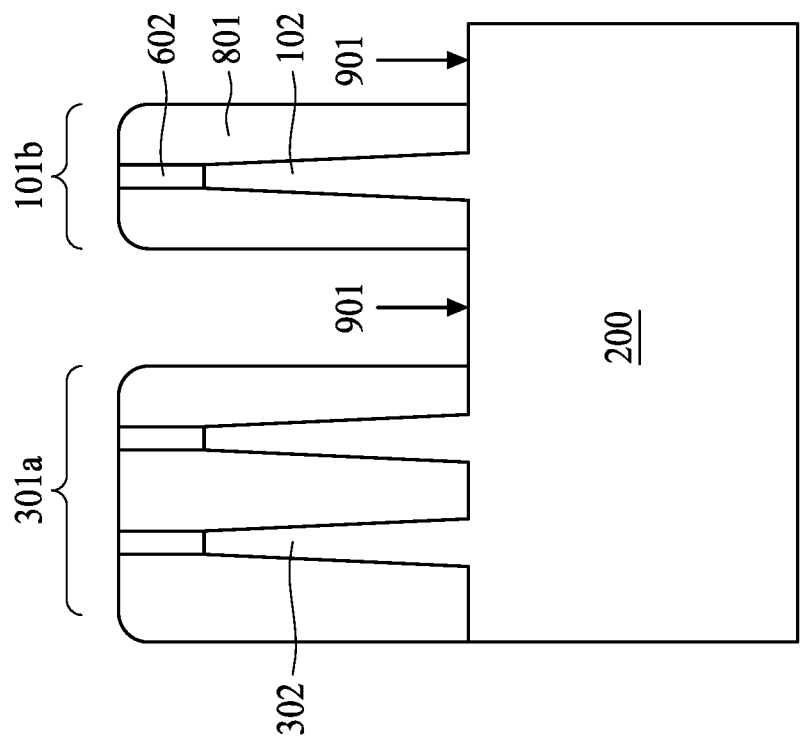

Referring to FIG. 5 and FIG. 9, the method 500 includes operation 506, in which the spacer material 801 is patterned to expose a portion 901 of the substrate 200. The spacer material 801 is etched. In some embodiments, the spacer material 801 is anisotropically etched. In various examples, etching of the spacer material 801 may include a multiple-step etching process to improve etch selectivity and provide over-etch control. In some embodiments, the etching of the spacer material 801 removes the spacer material 801 between the fin structures 301a and 101b, exposing the underlying substrate 200.

Figure 10:
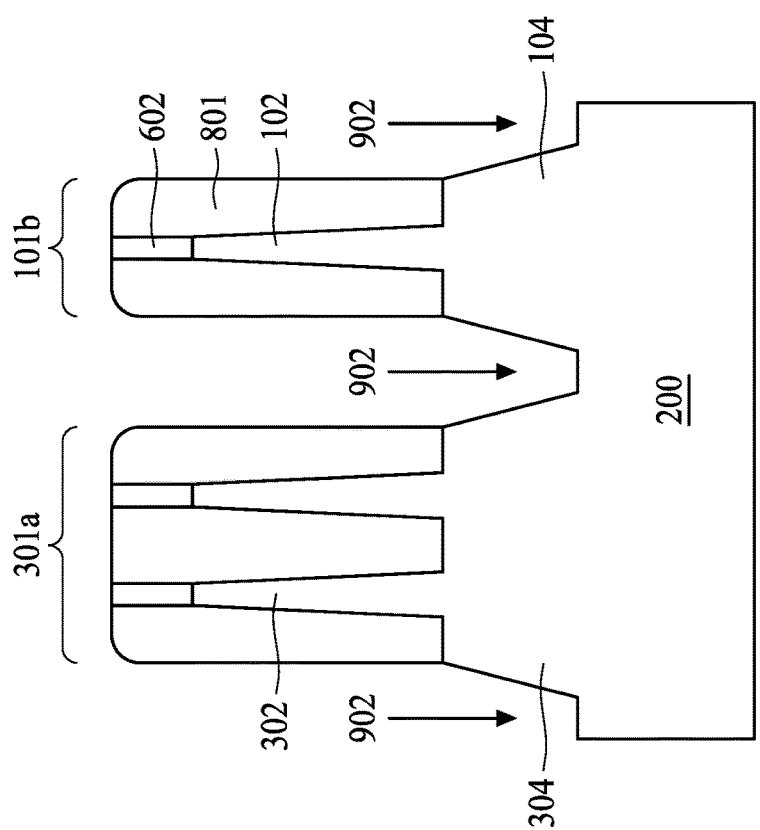

Referring to FIG. 5 and FIG. 10, the method 500 includes operation 508, in which the portion 901 (shown in FIG. 9) of the substrate 200 is etched to form the second fin parts 104 and 304 under the first fin parts 102 and 302. In some embodiments, a plurality of trenches 902 are formed within the substrate 200. In various embodiments, the plurality of trenches 902 are formed by etching (e.g., by a wet etch or a dry etch) the substrate 200. In particular, the etching of the substrate 200 to form the plurality of trenches 902 also serves to form a plurality of second fin parts 104 and 304. In some embodiments, the isotropy of the etch used to form the trenches 902 may be tuned in order to provide a desired fin profile (i.e., fin angle) of the second fin parts 104 and 304. Moreover, use of the previously patterned features (i.e., the first fin parts 102 and 302 and the spacer material 801) as a mask to pattern subsequent features (i.e., the trenches 902 and second fin parts 104 and 304) enables formation of self-aligned, multi-stage fins. Fabrication of the semiconductor device 300, which may include a FinFET device, using such a self-aligned process serves to mitigate at least some of the problems associated with lithographic patterning of highly-scaled structures and devices.

Figure 11:
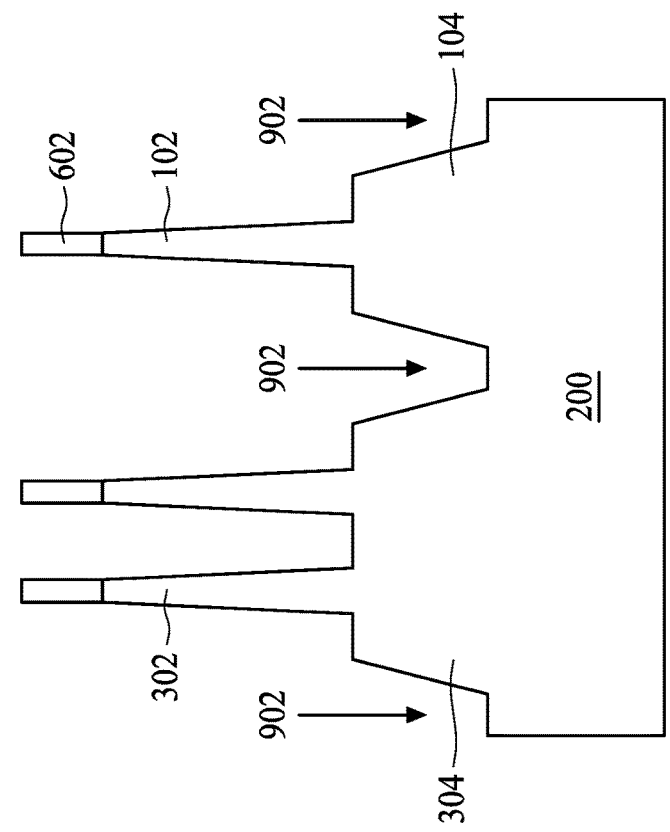

Referring to FIG. 5 and FIG. 11, the method 500 includes operation 510, in which the spacer material 801 (shown in FIG. 10) is removed. The spacer material 801 on the sidewalls of each of the first fin parts 102 and 302 is selectively removed (e.g., by a wet etching or a dry etching process), leaving the first fin parts 102 and 302 and the second fin parts 104 and 304.

Figure 12:
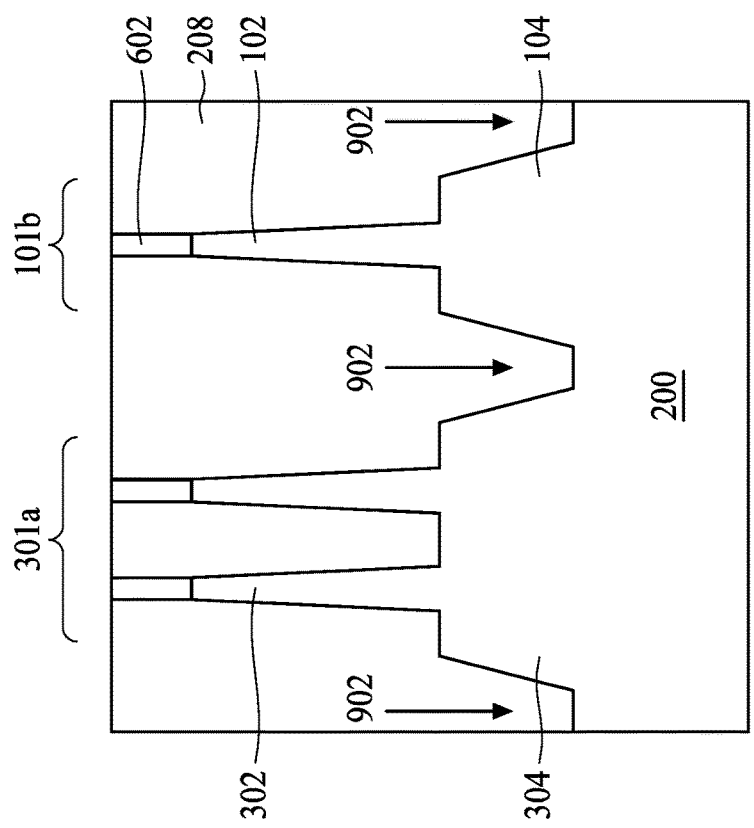

Referring to FIG. 5 and FIG. 12, the method 500 includes operation 512, in which a dielectric layer 208 is deposited over the substrate 200 to cover the first fin parts 102 and 302 and the second fin parts 104 and 304. The dielectric layer 208 is deposited over the substrate 200, filling the trenches 902 with the dielectric layer 208 and thereby isolating neighboring fin structures 101a and 301a. In a further embodiment, the dielectric layer 208 used to form the isolation regions is thinned and planarized, for example by a CMP process. For example, a CMP process may be performed to remove excess dielectric layer 208 material (used to form the isolation regions) and planarize a top surface of the semiconductor device 300. In some embodiments, the isolation regions interposing the fin structures 101a and 301a may include a multi-layer structure, for example, a structure having one or more liner layers.

Figure 13:
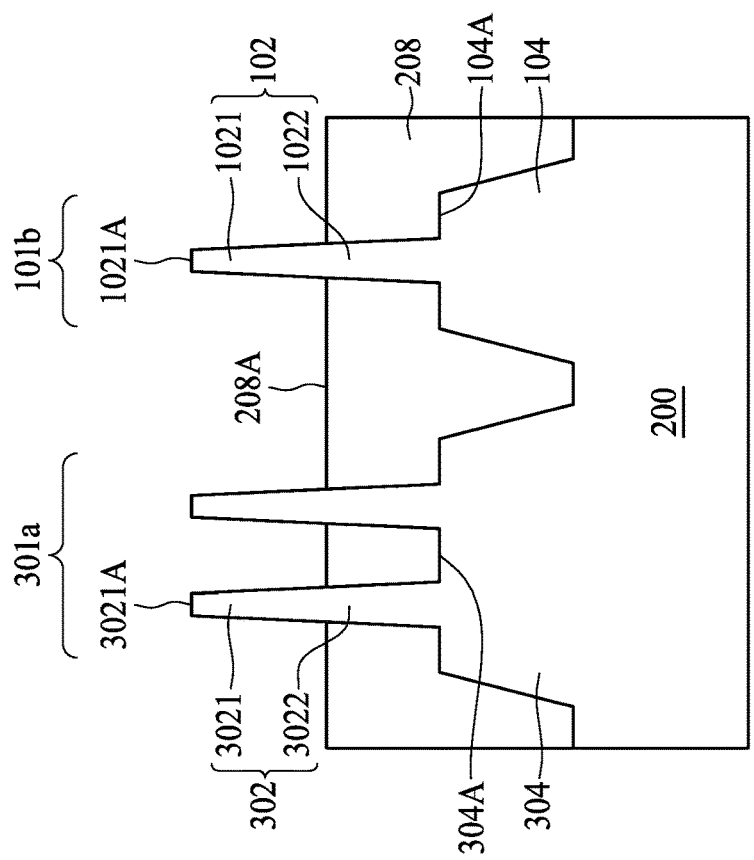

Referring to FIG. 5 and FIG. 13, the method 500 includes operation 514, in which a portion of the dielectric layer 208 is removed to expose the upper regions 1021 and 3021 of the first fin parts 102 and 302. In some embodiments, a top surface 208A of the dielectric layer 208 after the removal is lower than the top surfaces 1021A and 3021A of the first fin parts 102 and 302, and higher than the top surfaces 104A and 304A of the second fin parts 104 and 304. In some embodiments, the recessing operation may include a dry etching operation, a wet etching operation, and/or a combination thereof. The dielectric layer 208 around the each of the fin structures 101a and 301a is recessed to laterally expose the upper regions 1021 and 3021 of the first fin parts 102 and 302. In some embodiments, a recessing depth is controlled (e.g., by controlling an etching time) so as to produce a desired height of the exposed upper regions 1021 and 3021.

In an additional embodiment, the hard mask layer 602 (shown in FIG. 12) is removed from the fin structures 101a and 301a, leaving the fin structures 101a and 301a as described above. In some embodiments, removal of the hard mask layer 602 may be performed prior to recessing of the dielectric layer 208. In other embodiments, the removal of the hard mask layer 602 may be performed after the recessing of the dielectric layer 208. In some embodiments, a well implant may also be performed (e.g., into one or both of the first fin parts 102 and 302 and second fin parts 104 and 304) using an ion implantation process and employing a suitable N-type or P-type dopant.

Figure 14:
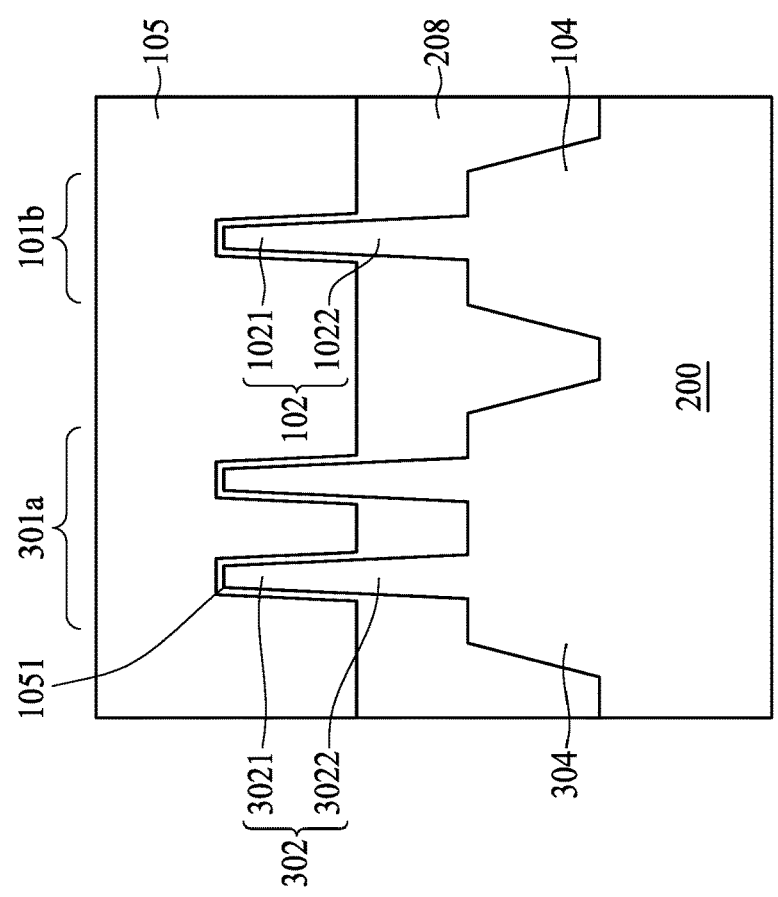

Referring to FIG. 5 and FIG. 14, the method 500 includes operation 516, in which a gate structure 105 is formed on the dielectric layer 208 to cover a first area 105a (shown in FIG. 3 as gate structure) of the upper regions 1021 and 3021, and second areas 103a and 103b (shown in FIG. 3 as source/drain regions) of the upper regions 1021 and 3021 are exposed. In some embodiments, the first area 105a of the first fin parts 102 and 302 is the area in which the gate structure 105 is formed, and the second areas 103a and 103b of the first fin parts 102 and 302 are the areas for the source/drain regions. It should be noted that FIG. 14 illustrates a portion of the cross-sectional view of the semiconductor device 300 along a plane substantially parallel to line AA of FIG. 3.

The gate structure 105 may include high-K/metal gate stacks. The gate structure 105 may be deposited and patterned on the dielectric layer 208. In some embodiments, the gate structure 105 may include an interfacial layer 1051 formed over the first fin parts 102 and 302 (which includes a FinFET channel region), a high-K gate dielectric layer (not shown) formed over the interfacial layer 1051, and a metal layer (not shown) formed over the high-K gate dielectric layer.

Figure 15:
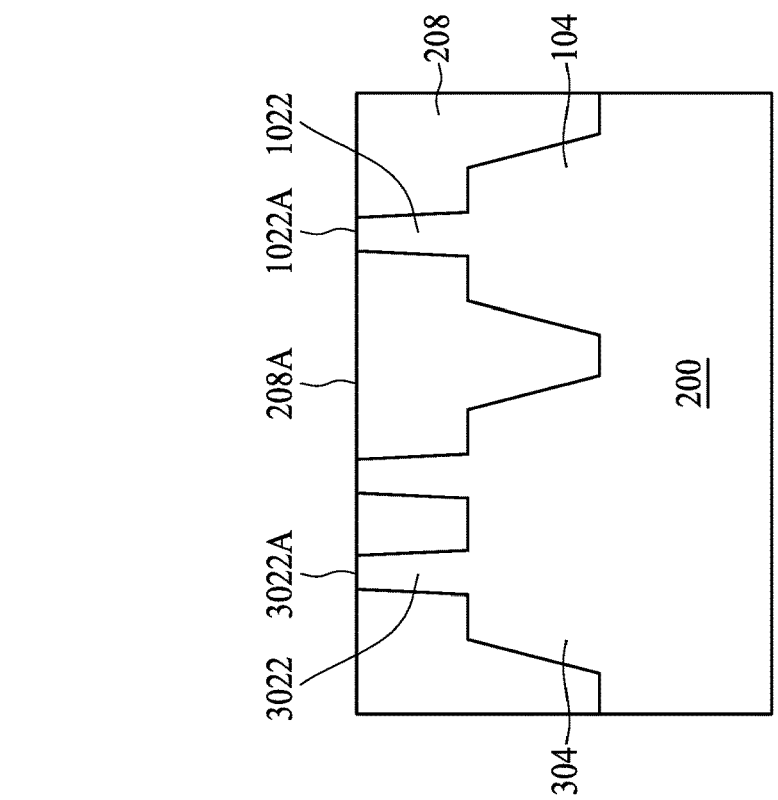

Referring to FIG. 5 and FIG. 15, the method 500 includes operation 518, in which the second areas 103a and 103b (shown in FIG. 3) of the upper regions 1021 and 3021 are removed to obtain the shortened first fin parts 1022 and 3022. The top surfaces 1022A and 3022A of the shortened first fin parts 1022 and 3022 are exposed through the top surface 208A of the dielectric layer 208 after the removal. It should be noted that FIG. 15 illustrates a portion of the cross-sectional view of the semiconductor device 300 along a plane substantially parallel to line BB of FIG. 3.

Figure 16:
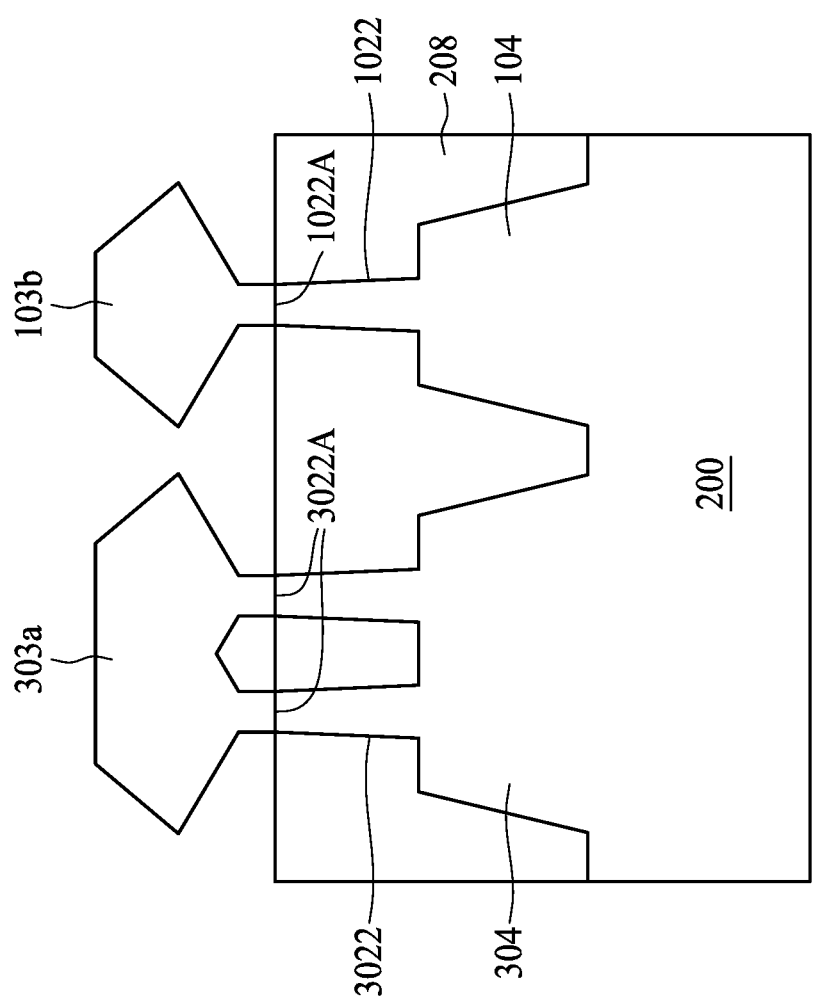

Referring to FIG. 5 and FIG. 16, the method 500 includes operation 520, in which the source/drain regions 103b and 303a are formed on the top surfaces 1022A and 3022A of the shortened first fin parts 1022 and 3022. The source/drain regions 103b and 303a may be epitaxially grown from the top surfaces 1022A and 3022A of the shortened first fin parts 1022 and 3022.

It should be noted that the first fin parts 102 and 302 may be the protrusion portions, the second fin parts 104 and 304 may be the base portion and the third-stage fin region, the upper regions 1021 and 3021 may be the first-stage fin regions, and the shortened first fin parts 1022 and 3022 may be the second-stage fin regions. The detailed description of the features is similar to descriptions of features shown in FIG. 1, FIG. 2A, FIG. 2B, FIG. 3, FIG. 4A and FIG. 4B, and is therefore omitted herein for brevity.

The semiconductor device 300 may undergo further operations to form various features and regions known in the art. For example, subsequent operations may include an interlayer dielectric (e.g., on the gate structure 105), source/drain features (e.g., epitaxially grown source/drain features), on or more etch stop layers, one or more interlayer dielectric (ILD) layers, contact openings, contact metal, and various contacts/vias/lines and multilayer interconnect features (e.g., metal layers and interlayer dielectrics) on the substrate 200, configured to connect the various features to form a functional circuit that may include one or more FinFET devices. In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper-related multilayer interconnection structure. Moreover, additional process steps may be implemented before, during, and after the method 500, and some operations described above may be replaced or eliminated in accordance with various embodiments of the method 500.

In summary, as described above, the present disclosure offers a method for forming a multi-stage fin profile which addresses many of the shortcomings of current processing techniques, including misalignment of critical features and difficulty of deployment of strained layers on narrow fin structures. In addition, the first fin parts 102 and 302 and the wider second fin parts 104 and 304 may increase the surface area for doping operation, thereby increasing the doping efficiency in the fin structures 101b and 301a. Thus, semiconductor device 300 may be scaled down, and the well resistance and latch-up effect in each cell may also be alleviated.

Those of skill in the art will readily appreciate that the methods and structures described herein may be applied to a variety of other semiconductor devices to advantageously achieve similar benefits from such other devices without departing from the scope of the present disclosure.

According to some embodiments, a semiconductor device is provided. The semiconductor device includes a substrate, a fin structure, a source/drain region, and a gate structure. The fin structure is on the substrate. The fin structure includes a first-stage fin region, a second-stage fin region, and a third-stage fin region. The second-stage fin region is under the first-stage fin region. The third-stage fin region is under the second-stage fin region. The source/drain region is on a top surface of the second-stage fin region. The gate structure is above the first-stage fin region and wraps around a top surface and sidewalls of the first-stage fin region. The top surface of the second-stage fin region is lower than the top surface of the first-stage fin region. A width of the third-stage fin region is greater than a width of the second-stage fin region, and the width of the second-stage fin region is substantially the same as a width of the first-stage fin region.

According to other embodiments, a semiconductor device is provided. The semiconductor device includes a substrate, a first fin structure, a first source/drain region, and a gate structure. The first fin structure is on the substrate. The first fin structure includes a first base portion and a plurality of first protrusion portions. The plurality of first protrusion portions are on the first base portion. The first base portion extends laterally from sidewalls of the first protrusion portions and forms steps at both sides of the first fin structure. The first source/drain region is on a first top surface of the first fin structure. The gate structure is on a second top surface of the first fin structure and wraps around sidewalls of the first protrusion portion above the first top surface. The second top surface is higher than the first top surface.

According to other embodiments, a method of forming a semiconductor device is provided. The method includes the following operations. A first fin part is formed on a substrate. A spacer material is formed on the substrate and over the first fin part. The spacer material is patterned to expose a portion of the substrate. The portion of the substrate is etched to form a second fin part under the first fin part. The spacer material is removed. A dielectric layer is deposited over the substrate to cover the first fin part and the second fin part. A portion of the dielectric layer is removed to expose an upper region of the first fin part, wherein a top surface of the dielectric layer after the removal is lower than a top surface of the first fin part and higher than a top surface of the second fin part. A gate structure is formed on the dielectric layer to cover a first area of the upper region and a second area of the upper region is exposed from the gate structure. The second area of the upper region is removed to obtain a shortened first fin part. A source/drain region is formed on a top surface of the shortened first fin part.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a fin structure on the substrate, comprising:
      a first-stage fin region;
      a second-stage fin region under the first-stage fin region; and
      a third-stage fin region under the second-stage fin region;
   a source/drain region on a top surface of the second-stage fin region; and
   a gate structure over the first-stage fin region, configured to wrap around a top surface and sidewalls of the first-stage fin region, wherein the top surface of the second-stage fin region is lower than the top surface of the first-stage fin region, and a bottom of the gate structure is coplanar with a bottom of the source/drain region; and
   wherein a width of the third-stage fin region is greater than a width of the second-stage fin region, and the width of the second-stage fin region is substantially the same as a width of the first-stage fin region.

2. The semiconductor device of claim 1, wherein a width of the first-stage fin region is between about 3 nm and about 10 nm, a width of the second-stage fin region is between about 5 nm and about 10 nm, and a width of the third-stage fin region is between about 30 nm and about 80 nm.

3. The semiconductor device of claim 1, wherein the third-stage fin region comprises an extension portion extending from a sidewall of the second-stage fin region.

4. The semiconductor device of claim 3, wherein a width of the extension portion is between about 5 nm and about 40 nm.

5. The semiconductor device of claim 3, wherein a width of the extension portion is substantially the same as the width of the second-stage fin region.

6. The semiconductor device of claim 1, further comprising:
   a dielectric layer over the third-stage fin region and wrapping around sidewalls of the second-stage fin region.

7. The semiconductor device of claim 1, wherein a ratio of a height of the first-stage fin region to a height of the second-stage fin region is between about 0.5 and about 2.7.

8. The semiconductor device of claim 1, wherein a height of the first-stage fin region is between about 40 nm and about 80 nm, a height of the second-stage fin region is between about 30 nm and about 70 nm, and a height of the third-stage fin region is between about 30 nm and about 120 nm.

9. The semiconductor device of claim 1, wherein a width of the source/drain region is substantially the same as the width of the second-stage fin region.

10. The semiconductor device of claim 1, wherein the source/drain region is connected to the first-stage fin region.

11. A semiconductor device, comprising:
a substrate;
a first fin structure on the substrate, comprising:
  a first base portion; and
  a plurality of first protrusion portions on the first base portion, wherein the first base portion extends laterally from sidewalls of the first protrusion portions and forms steps at both sides of the first fin structure;
a first source/drain region on a first top surface of the first fin structure; and
a gate structure on a second top surface of the first fin structure and wrapping around sidewalls of the first protrusion portion above the first top surface, wherein the second top surface is higher than the first top surface, and a bottom of the gate structure is coplanar with a bottom of the first source/drain region.

12. The semiconductor device of claim 11, further comprising:
a second fin structure further formed on the substrate and adjacent to the first fin structure, comprising:
  a second base portion; and
  a second protrusion portion on the second base portion, wherein the second base portion extends laterally from sidewalls of the second protrusion portions and forms steps at both sides of the second fin structure.

13. The semiconductor device of claim 12, further comprising:
a second source/drain region on a third top surface of the second fin structure;
wherein the gate structure is also on a fourth top surface of the second fin structure and wraps around sidewalls of the second protrusion portion above the third top surface, and wherein the fourth top surface is higher than the third top surface.

14. The semiconductor device of claim 13, wherein the second protrusion portion surrounded by the gate structure comprises a Ge atomic concentration between about 10% and about 40%.

15. The semiconductor device of claim 12, wherein a width of the first base portion is greater than a width of the second base portion.

16. The semiconductor device of claim 11, wherein a width of the first base portion is between about 55 nm and about 150 nm.

17. The semiconductor device of claim 11, wherein each of the first protrusion portions comprises an anti-punch through (APT) doping area.

18. A semiconductor device, comprising:
a substrate;
a first fin structure on the substrate, comprising:
  a first base portion; and
  a plurality of first protrusion portions on the first base portion, wherein the first base portion extends laterally from sidewalls of the first protrusion portions and forms steps at both sides of the first fin structure;
a second fin structure further formed on the substrate and adjacent to the first fin structure, comprising:
  a second base portion; and
  a second protrusion portion on the second base portion, wherein the second base portion extends laterally from sidewalls of the second protrusion portions and forms steps at both sides of the second fin structure; and
a gate structure on a second top surface of the first fin structure and wrapping around sidewalls of the first protrusion portion above the first top surface, and the gate structure is also on a fourth top surface of the second fin structure and wraps around sidewalls of the second protrusion portion above the third top surface, wherein the second top surface is higher than the first top surface, and the fourth top surface is higher than the third top surface;
wherein the second protrusion portion surrounded by the gate structure comprises a Ge atomic concentration between about 10% and about 40%.

19. The semiconductor device of claim 18, wherein a width of the first base portion is greater than a width of the second base portion.

20. The semiconductor device of claim 18, wherein each of the first protrusion portions comprises an anti-punch through (APT) doping area.

* * * * *